United States Patent [19]

Miyakuni

[11] Patent Number: 5,512,331
[45] Date of Patent: Apr. 30, 1996

[54] ETCHING METHOD FOR INDIUM SERIES COMPOUND SEMICONDUCTORS

[75] Inventor: Shinichi Miyakuni, Itami, Japan

[73] Assignee: Mitsubishi Denki Kabushiki Kaisha, Tokyo, Japan

[21] Appl. No.: 283,819

[22] Filed: Aug. 1, 1994

[30] Foreign Application Priority Data

Aug. 31, 1993 [JP] Japan ................................... 5-215455

[51] Int. Cl.$^6$ ....................................................... B44C 1/22
[52] U.S. Cl. ........................ 427/528; 427/535; 156/625.1
[58] Field of Search .................................... 156/625, 643, 156/646; 427/528, 535

[56] References Cited

U.S. PATENT DOCUMENTS 5,068,007 11/1991 Roger et al. ............................. 156/643
5,304,514 4/1994 Nishibe et al. ......................... 457/225

Primary Examiner—W. Robinson M. Clark
Attorney, Agent, or Firm—Leydig, Voit & Mayer

[57] ABSTRACT

An etching method for an In series compound semiconductor includes etching in a plasma etching of a flowing mixture of a halogen and nitrogen, the flow ratio of halogen to nitrogen being lower than 1, and at a gas pressure below 0.5 mTorr. An etching method for an In series compound semiconductor includes etching in a plasma etching apparatus and a mixture of halogen/inactive gas/nitrogen gas, the flow rate ratio of halogen/(halogen+inactive gas+nitrogen gas) being lower than 0.1, the flow rate ratio of nitrogen/(halogen+inactive gas+nitrogen gas) being above 0.1, and the gas pressure being below 0.5 mTorr. Etching at low ion energy produces good surface morphology, a vertical side surface configuration having an etched concave portion, and low damage.

8 Claims, 13 Drawing Sheets

ETCHING METHOD FOR INDIUM SERIES COMPOUND SEMICONDUCTORS

FIELD OF THE INVENTION

The present invention relates to an etching method for etching In series compound semiconductors and, more particularly, to that which performs etching efficiently in a plasma having a high electric discharge efficiency of using a gaseous mixture of a halogen and nitrogen.

BACKGROUND OF THE INVENTION

When etching an In series compound semiconductor using a halogen gas, the vapor pressure of the reaction product of In and the crystal and halogen gas is quite low. In contrast thereto, the vapor pressure of other reaction products and the halogen gas is high. For example, when InP is etched with chlorine, the vapor pressure of $InCl_3$ is $10^{-8}$ Torr at 100° C. and the vapor pressure of $PCl_3$ is 57 Torr at 400° C. Therefore, reaction products other than In compounds are likely to be selectively desorbed from the In series compound semiconductor, and there arise problems that surface roughness occurs after etching and a tapered etched configuration is produced. In order to solve these problems, physical sputtering with high energy ions having energies of several hundreds of eV to several thousands of eV employing RIBE (reactive ion beam etching) or RIE (reactive ion etching) at a substrate temperature above 200° C. to promote desorption, has been examined. However, these methods involve a large impact by ions accelerated to a high energy, whereby the substrate is damaged.

The prior art etching of In series compound semiconductors is performed as described above. It was difficult to etch In series compound semiconductors to produce a good surface morphology and make the side surfaces of the etched concave portion vertical, thereby resulting in less damage.

The inventor of the present invention has invented an etching method for etching of In series compound semiconductors at low ion energy by employing an ECR etching apparatus and employing a $Cl_2$/He mixture which is obtained by diluting $Cl_2$ gas with He gas more than four times to make the ratio of $Cl_2$/(He+$Cl_2$) 0.05~0.2 and using a gas pressure below $4.0 \times 10^{-4}$ Torr. By employing this etching method, it is possible to etch In series compound semiconductors with good surface morphology and low damage. In this method, however, there is a tapered etched side surface of the etched concave portion and it has been impossible to etch In series compound to produce an etched side surface having an etched concave portion that is vertical.

SUMMARY OF THE INVENTION

It is an object of the present invention to provide an etching method for In series compound semiconductors that performs an etching that results good surface morphology, and low damage.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, an etching method for In series compound semiconductors, comprises etching an In series semiconductor, employing a plasma etching apparatus having an electric discharge efficiency of above $10^{10}$ cm$^{-3}$, and using a mixture of a halogen and nitrogen having a flow rate ratio of halogen to nitrogen lower than 1, and a gas pressure below 0.5 mTorr.

According to a second aspect of the present invention, an etching method for In series compound semiconductors, comprises etching an In series semiconductor employing a plasma etching apparatus having an electric discharging efficiency of above $10^{10}$ cm$^{-3}$, and using a mixture of a halogen/inactive gas/nitrogen gas having a flow rate ratio of halogen/(halogen+inactive gas+nitrogen gas) lower than 0.1 and a flow rate ratio of nitrogen/(halogen+ inactive gas+ nitrogen gas) above 0.1, and a gas pressure below 0.5 mTorr.

According to a third aspect of the present invention, an etching method for an In series compound semiconductor includes etching an In series compound semiconductor employing a composite magnetic field type electron cyclotron resonance etching apparatus, employing a nitrogen mixture having a flow rate of chlorine gas to nitrogen gas below 1 and making the total gas flow rate ratio 10 SCCM, the gas pressure 0.4 mTorr, the microwave power 200 W, the RF power 30 W, the main magnetic intensity 13 A, the auxiliary magnetic field intensity 25 A, and the substrate temperature 100°~200° C.

According to a fourth aspect of the present invention, an etching method for an In series compound semiconductor includes etching an In series compound semiconductor employing a composite magnetic field type electron cyclotron resonance etching apparatus, employing a mixture of a halogen/inactive gas/nitrogen gas having a flow rate ratio of halogen/(halogen+inactive gas+nitrogen gas) lower than 0.1, a flow rate ratio of halogen/(halogen+inactive gas+ nitrogen gas) above 0.1, a gas pressure below 0.5 mTorr, a mixed gas flow rate ratio of chlorine gas to nitrogen gas below 1, and making the total gas flow rate 10 SCCM, the gas pressure 0.4 mTorr, the microwave power 200 W, the RF power 30 W, the main magnetic intensity 13 A, the auxiliary magnetic field intensity 25 A, and the substrate temperature 100°~200° C.

In accordance with the first aspect of the present invention, etching at a low ion energy can be performed and etching that produces good surface morphology and a vertical side wall configuration having an etched concave portion with low damage can be performed against In series compound semiconductor.

In accordance with the second aspect of the present invention, etching at low ion energy can be performed and etching that produces good surface morphology and a vertical side wall configuration having an etched concave portion with low damage can be performed in an In series compound semiconductor.

DETAILED DESCRIPTION OF THE PREFERRED EMBODIMENTS

Embodiment 1

In a first embodiment of the present invention, low energy ion etching at several tens of eV employs a composite magnetic field ECR (electron cyclotron resonance) etching apparatus and a $Cl_2/N_2$ mixture in etching an etching method for etching In series compound semiconductor. In this embodiment, an InP crystal is used in the experimentations as a typical example of a In series compound semiconductor and investigations thereon were performed.

Figure 1:
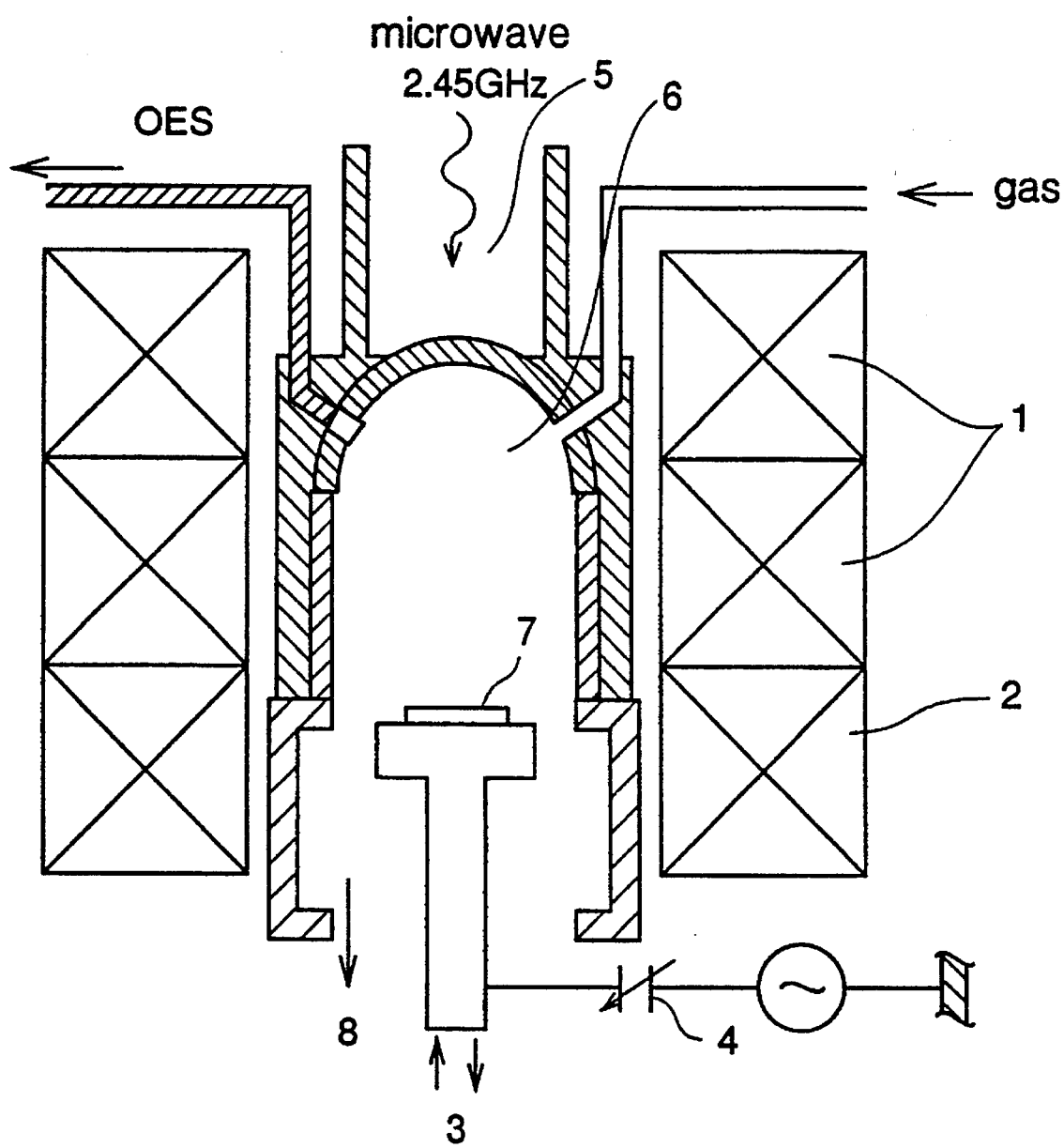
FIG. 1 is a diagram illustrating a structure of a composite magnetic field type ECR etching apparatus used in a first embodiment of the present invention.

FIG. 1 is a diagram illustrating a structure of a composite magnetic field type ECR etching apparatus used in a first embodiment of the present invention. In the experimentations of this first embodiment, in order to investigate the mechanism for etching an InP crystal employing low energy ions, a composite magnetic field type ECR etching apparatus that can vary the energy of ions incident on the substrate from several eV to several tens of eV by application of substrate RF power (frequency is 13.56 MHz) is used. In the figure, reference numeral 1 designates a main magnetic field coil for producing a main magnetic field and reference numeral 2 designates an auxiliary magnetic field coil for producing an auxiliary magnetic field. Reference numeral 3 designates cooling water, flow reference numeral 4 designates an RF oscillator, reference numeral 5 designates a quartz window. Reference numeral 6 designates a plasma generating chamber. Reference numeral 7 designates a wafer. Reference numeral 8 designates a vacuum exhaust flow. This apparatus includes a plasma generating chamber 6, a load locking chamber, a composite magnetic field (main magnetic field/auxiliary magnetic field) system, a substrate holder, a waveguide, a microwave oscillator, an exhaust system, and a supply system. The internal diameter of the plasma generating chamber 6 is 260 mm and the diameter of the substrate holder is 210 mm. The oscillation frequency of the microwave is 2.45 GHz, and the ECR resonance magnetic field corresponds to 875 G. The ECR resonance point comes close to the microwave oscillation source when the main magnetic field intensity is lowered and it comes close to the substrate 7 when the main magnetic field intensity is heightened. The distance from the ECR resonance surface to the wafer 7 varies depending on the intensity of the composite magnetic field and is within 100 mm in the experimentations. It is possible to change the temperature of the substrate 7 from 100° C. to 250° C. in order to promote the desorption of reaction products. In this experiment, the relation between the Cl excited atoms in the plasma and the etching is noted and, therefore, an optical emission spectroscopy (OES) is introduced as an apparatus for measuring the state of the active species in the plasma. This is an apparatus for analyzing the state of various active species present in plasma by optical spectrometry of plasma emissions. The wavelength range that can be measured by this OES is from 250 to 1200 nm, and the light emission of excited chlorine atoms (Cl*: wavelength 725.6 nm) is monitored to investigate the atomic Cl intensity (in arbitrary units).

In addition, the spatial voltage at the center of the plasma at a position 1 cm from the front surface of the substrate 7 is measured by a planar probe (not illustrated) having a diameter of 6 mm, as a measure of the energy of ions incident on the substrate 7.

In this first embodiment, etching is performed under the conditions in table 1 shown below. Here, these conditions minimize the atomic Cl intensity, i.e., Cl excited atom light emission intensity.

TABLE 1

| kind of gas | $Cl_2/He$, $Cl_2/N_2$ |
|---|---|
| total gas flow rate (SCCM) | 10 |
| gas pressure (mTorr) | 0.4 |
| microwave power (W) | 200 |
| RF power (W) | 30 |
| main magnetic field intensity (A) | 13 |
| auxiliary magnetic field intensity (A) | 25 |
| substrate temperature (°C) | 100~200 |

Figure 2:
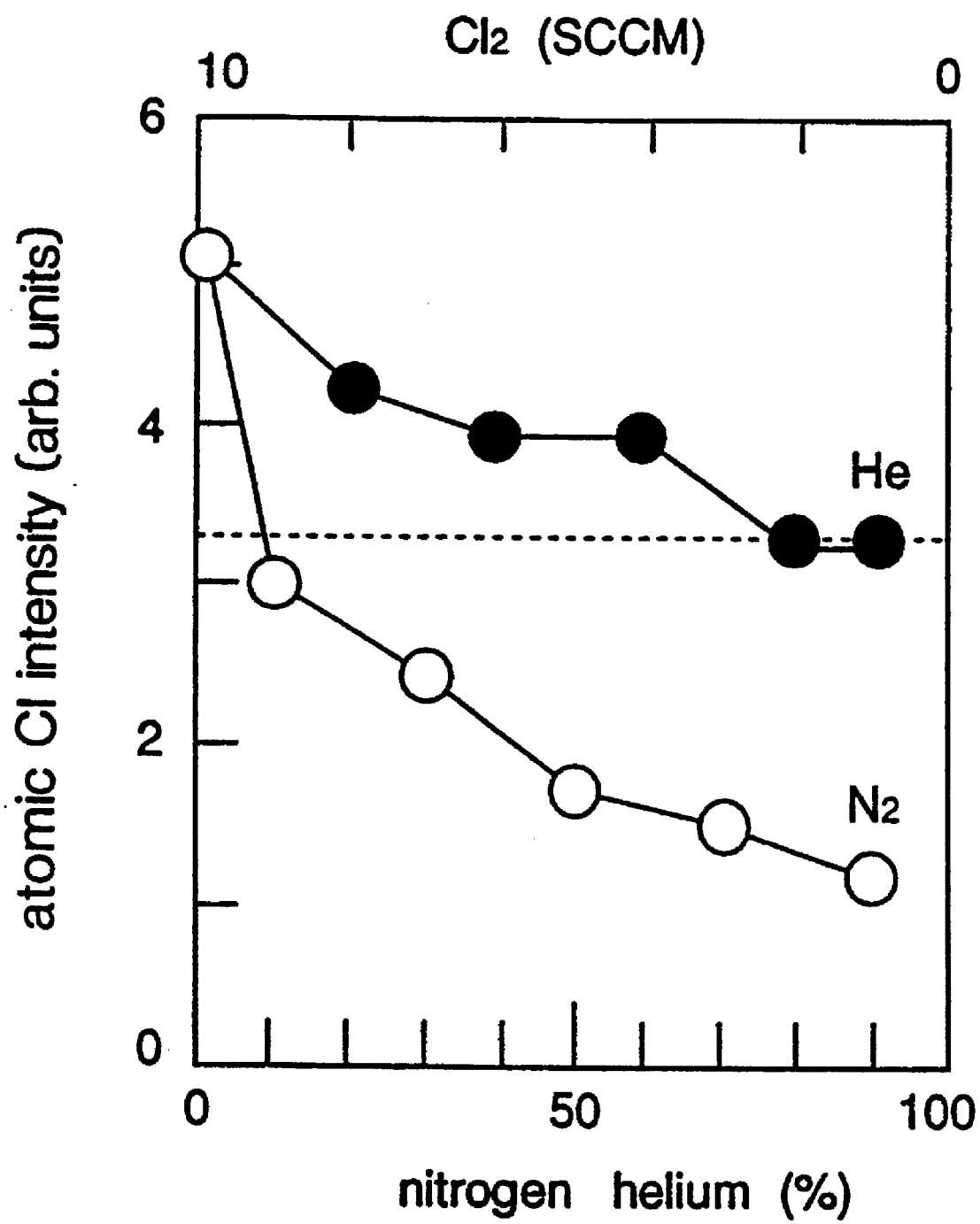
FIG. 2 is a diagram illustrating He gas, nitrogen gas dilution dependency of Cl excited atom light emission intensity according to the first embodiment of the present invention.

FIG. 2 is a diagram illustrating the result of a transformation of the Cl excited atom intensity is measured by OES under the condition shown in table 1 in a case where $Cl_2$ gas is diluted by He gas and $N_2$ gas. In the figure, the abscissa represents He gas concentration divided by the total gas flow rate ratio (He/(He+$Cl_2$)) and $N_2$ gas concentration divided by the total gas flow rate ratio ($N_2$/($N_2$+$Cl_2$)), and the ordinate represents the atomic Cl intensity. Here, the dependency of the Cl excited atom light emission intensity on the He concentration and on the $N_2$ concentration, are investigated.

It is found from FIG. 2 that while $Cl_2$ gas is diluted by He gas, or nitrogen gas, the atomic Cl intensity is reduced, it is possible to reduce the Cl intensity to a lower value when 10% of the total gas flow rate is diluted by nitrogen gas than when 90% of total gas flow rate is diluted by He gas ($Cl_2$/He:1 SCCM/9 SCCM). This is thought to be because $NCl_x$ (x=1~3) is generated by the reaction between the Cl active species in the $Cl_2/N_2$ mixed plasma and the desorpted N active species. It has become possible to further reduce the Cl excited species not by the dilution by an inactive gas such as He, but by gas reaction.

Figure 10:
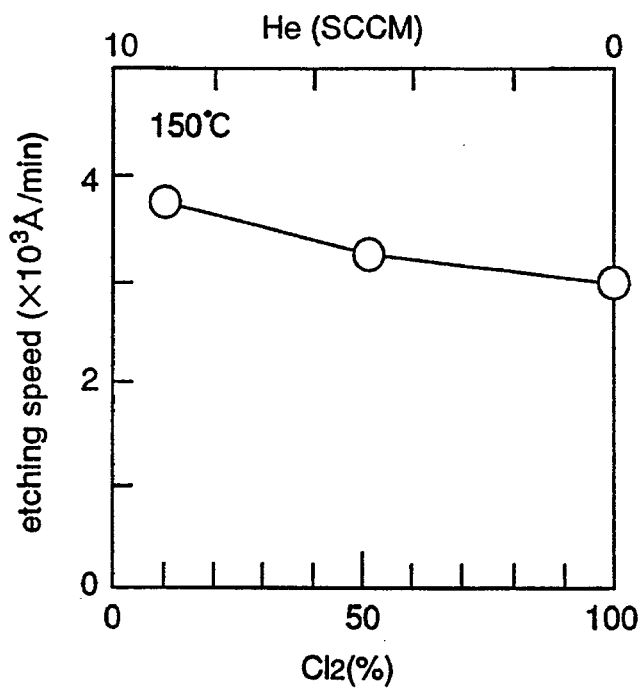
FIG. 10 is a diagram illustrating the gas low rate dependency of the etching speed of InP when $Cl_2/He$ varies and substrate temperature is 150° C. according to the first embodiment of the present invention.
Figure 11:
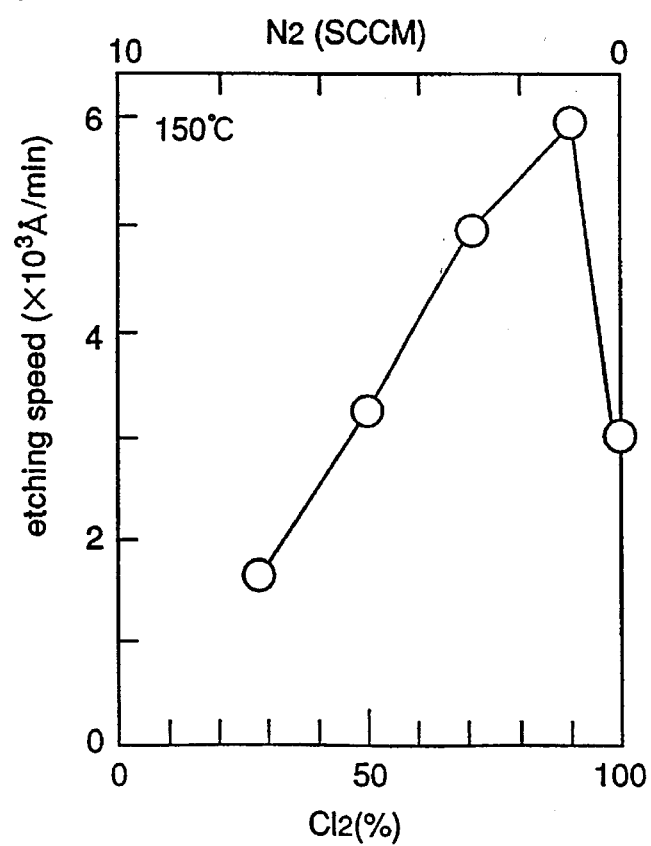
FIG. 11 is a diagram illustrating the gas flow rate dependency of the etching speed of InP when $Cl_2/N_2$ varies and substrate temperature is 150° C. according to the first embodiment of the present invention.

FIGS. 10 and 11 are diagrams illustrating the investigation results the dependency of the etching speed on the He concentration and $N_2$ concentration, respectively, when etching an InP crystal under the conditions shown in table 1, with the substrate temperature constant at 150° C. and varying the flow rate of $Cl_2$/He gas and $Cl_2/N_2$ gas, respectively. In FIG. 10, the abscissa represents $Cl_2$ gas concentration divided by the total flow rate of $Cl_2$/He gas ($Cl_2$/(He+$Cl_2$)), and the ordinate represents etching speed of the InP crystal. In FIG. 11, the abscissa represents $Cl_2$ gas concentration divided by the total flow rate of $Cl_2/N_2$ gas ($Cl_2$/($N_2$+$Cl_2$)) and the ordinate represents the etching speed of the InP crystal. As shown in FIG. 10, in the $Cl_2$/He system, with an increase in the proportion of the $Cl_2$ gas relative to the total flow rate, the etching speed decreases a little. On the contrary, in $Cl_2/N_2$ system, while until the $Cl_2$ gas becomes 90% of the total flow rate, the etching speed rapidly increases with an increase in the $Cl_2$ gas flow rate. When only $Cl_2$ gas flows, the etching speed rapidly decreases.

Figure 12:
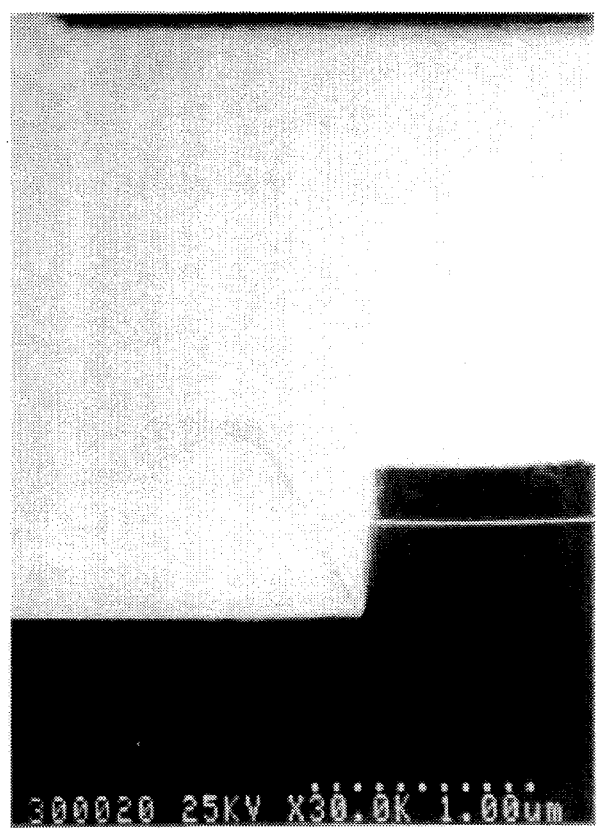
FIG. 12 is a diagram illustrating the etched configuration of an InP crystal when $Cl_2/N_2:3$ SCCM/7 SCCM and substrate temperature is 150° C. according to the first embodiment of the present invention.
Figure 13:
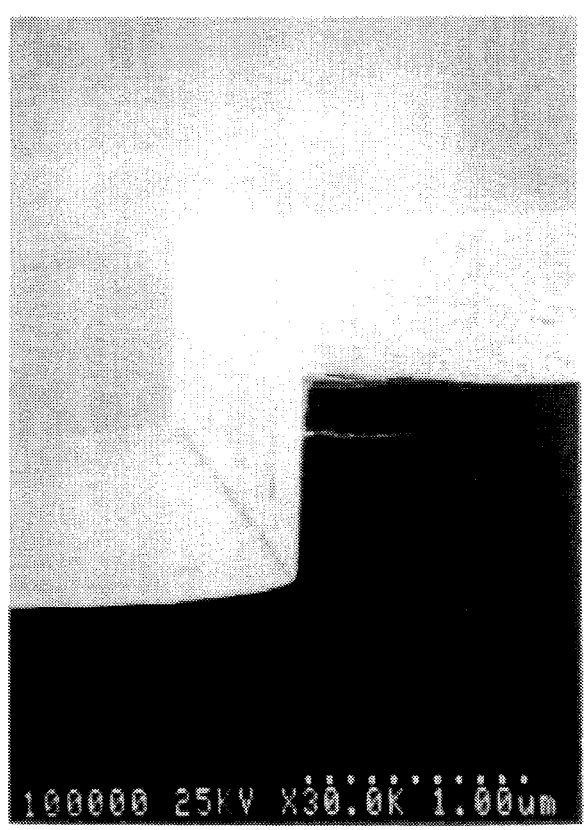
FIG. 13 is a diagram illustrating the etched configuration of an InP crystal when $Cl_2/N_2:5$ SCCM/5 SCCM and substrate temperature is 150° C. according to the first embodiment of the present invention.
Figure 14:
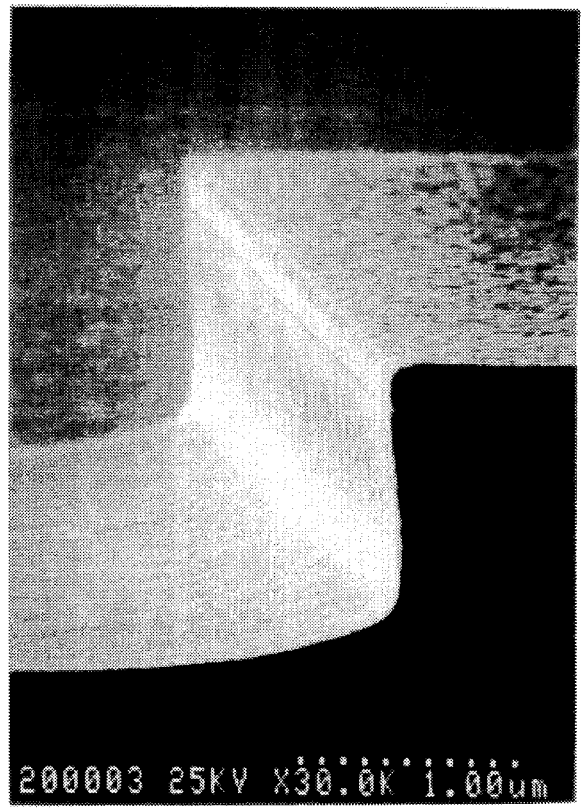
FIG. 14 is a diagram illustrating the etched configuration of an InP crystal when $Cl_2/N_2:7$ SCCM/3 SCCM and substrate temperature is 150° C. according to the first embodiment of the present invention.
Figure 15:
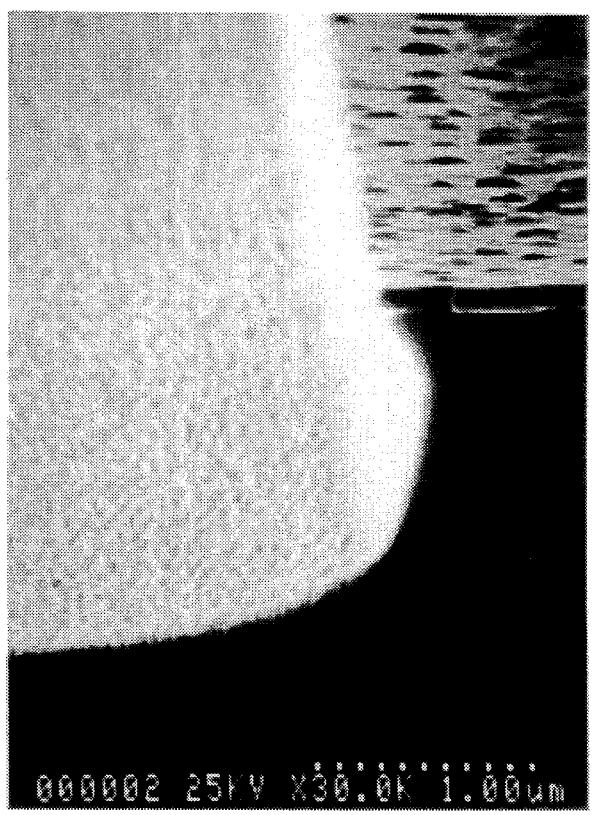
FIG. 15 is a diagram illustrating the etched configuration of an InP crystal when $Cl_2/N_2:9$ SCCM/1 SCCM and substrate temperature is 150° C. according to the first embodiment of the present invention.
Figure 16:
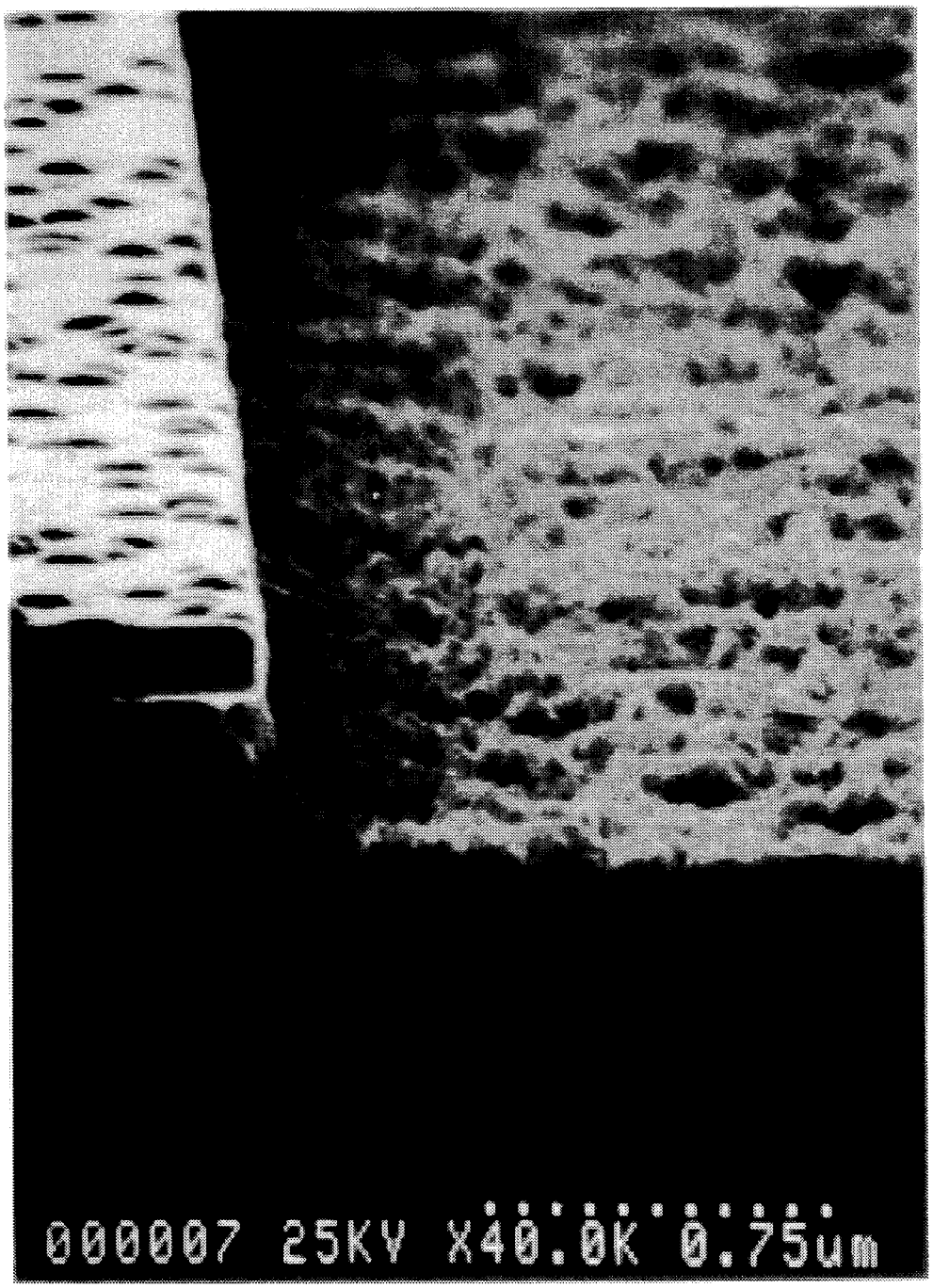
FIG. 16 is a diagram illustrating the etched configuration of an InP crystal when $Cl_2:10$ SCCM and substrate temperature is 150° C. according to the first embodiment of the present invention.

FIGS. 12~16 respectively show surface configurations when etching an InP crystal employing $Cl_2/N_2$ gas at a flow rate of 3 SCCM/7 SCCM, 5 SCCM/5 SCCM, 7 SCCM/3 SCCM, 9 SCCM/1 SCCM, and employing only $Cl_2$ gas ($Cl_2$:10 SCCM). In the $Cl_2$/He series gas, there arises roughness on the InP surface independent of the gas flow rate. In $Cl_2/N_2$ series gas, however, as shown in FIGS. 12 and 13, although the verticality of the side surface and the surface morphology of the etched concave portion are maintained until the gas flow rate becomes $Cl_2/N_2$:5 SCCM/5 SCCM, when the ratio of the $Cl_2$ is increased, the bottom surface of the etched concave portion becomes of tapered, thereby causing surface roughness as shown in FIGS. 14 to 16.

When the dc bias voltage that is applied between the plasma space voltage at 1 cm in front of the center of wafer and the substrate in etching with a the gas flow rate of $Cl_2/N_2$:3 SCCM/7 SCCM is measured, those respective values are 20 V and 8 V, and the sum of them is 28 V. Therefore, in order to obtain a preferable surface morphology of an InP crystal by etching by $Cl_2/N_2$ gas, an ion energy of below several tens of eV is sufficient.

Figure 5:
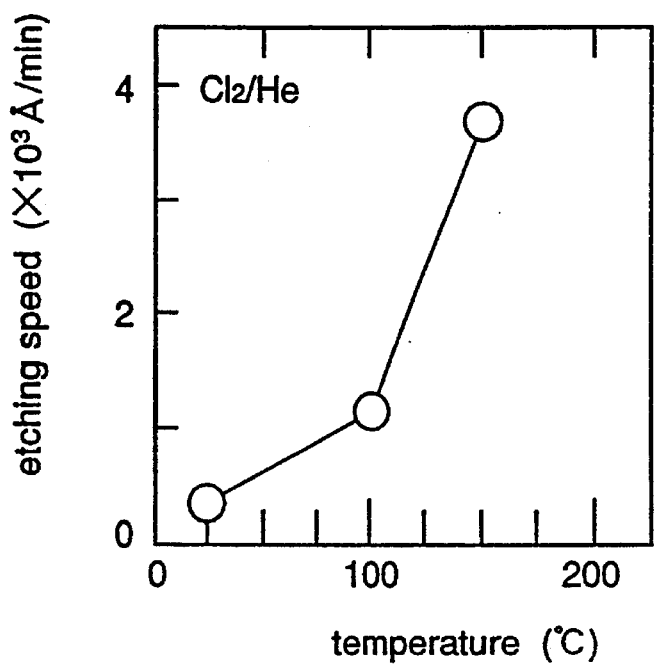
FIG. 5 is a diagram illustrating the substrate temperature dependency of the etching speed of InP when $Cl_2/He:1$ SCCM/9 SCCM according to the first embodiment of the present invention.
Figure 6:
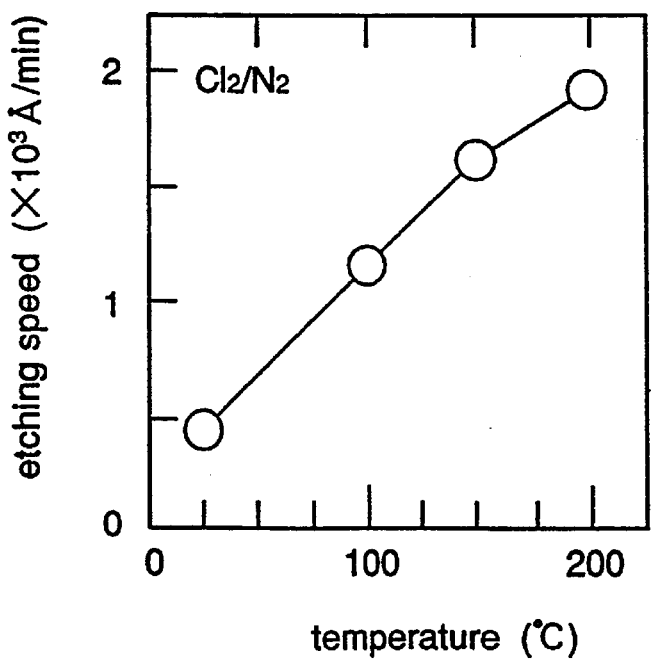
FIG. 6 is a diagram illustrating the substrate temperature dependency of the etching speed of InP when $Cl_2/N_2:3$ SCCM/7 SCCM according to the first embodiment of the present invention.

FIGS. 5 and 6 are diagrams illustrating the dependency between the etching speed and the substrate temperature when an InP crystal is etched under conditions of the gas flow rate being $Cl_2$/He:1 SCCM/9 SCCM, and $Cl_2/N_2$:3 SCCM/7 SCCM. From both figures, the etching speed increases with rising of the substrate temperature. Particularly, when employing $Cl_2$/He series gas, when the substrate temperature is raised from 100° C. to 150° C., the etching speed rapidly increases.

Figure 7:
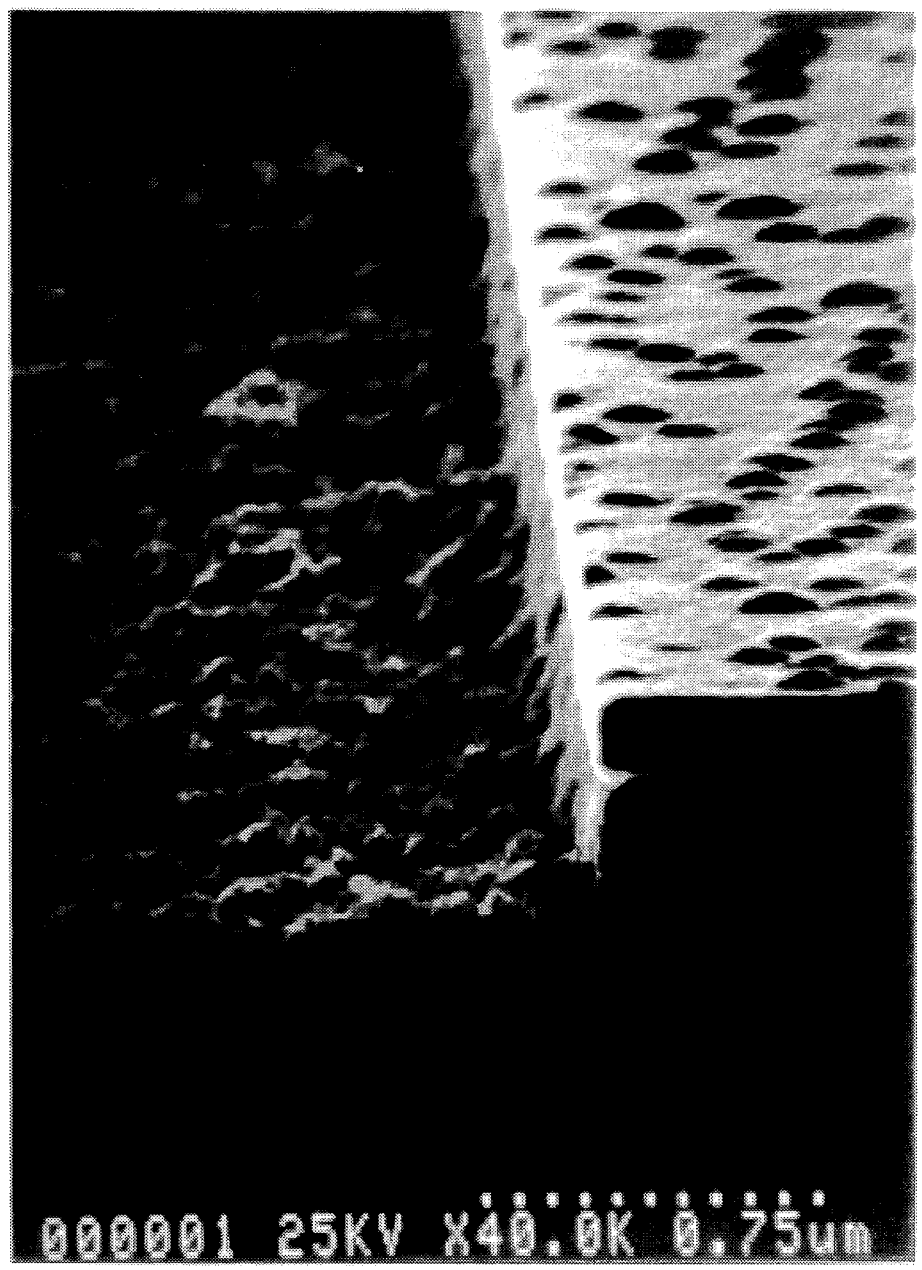
FIG. 7 is a diagram illustrating the etched configuration an InP crystal when $Cl_2/He:1$ SCCM/9 SCCM and substrate temperature is 100° C. according to the first embodiment of the present invention.
Figure 8:
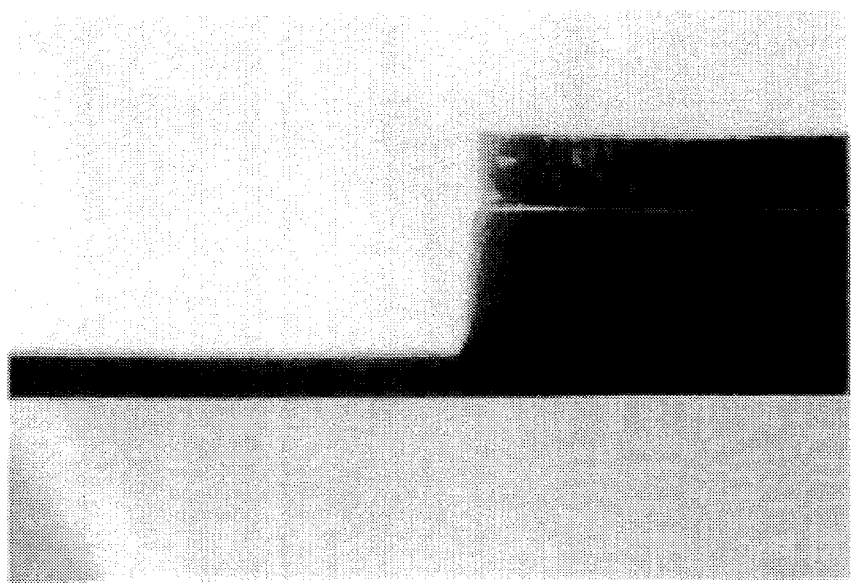
FIG. 8 is a diagram illustrating the etched configuration of an InP crystal when $Cl_2/N_2:3$ SCCM/7 SCCM and substrate temperature is 100° C. according to the first embodiment of the present invention.
Figure 9:
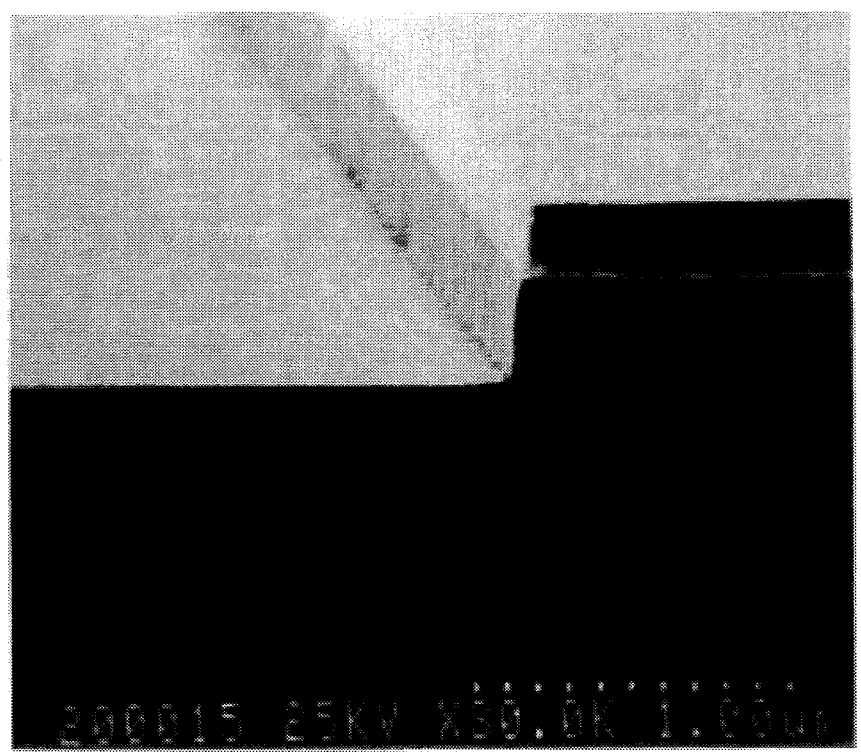
FIG. 9 is a diagram illustrating the etched configuration of an InP crystal when $Cl_2/N_2:3$ SCCM/7 SCCM and substrate temperature is 200° C. according to the first embodiment.

FIG. 7 is a diagram illustrating an etched configuration when an InP crystal is etched employing a mixture of $Cl_2$/He:1 SCCM/9 SCCM and the substrate temperature is 100° C. FIGS. 8 and 9 are diagrams illustrating etched configurations an InP crystal is etched employing a mixture of $Cl_2/N_2$:3 SCCM/7 SCCM and the substrate temperature is 100° C. and 200° C., respectively. As shown in FIG. 5, in a case where $Cl_2$/He series gas is employed, when the substrate temperature is 100° C., roughness arises on the etched surface, and this surface roughness does not improve even when the substrate temperature is further raised. When $Cl_2/N_2$ series gas is employed, as shown in FIG. 8, even when the substrate temperature is 100° C., it is possible to etch and produce a preferable surface morphology and that is prudent to the mask pattern and makes a side surface configuration having the etched concave portion vertical. In addition, when the substrate temperature is further raised to 200° C. to perform etching, the etched configuration does not change as shown in FIG. 9, and an etching speed which could not previously have obtained, i.e., 2000 Å/min, is obtained. Because the etching speed according to the conventional etching is about several hundreds of Å/min, it is possible to shorten the etching time by using such a high etching rate. For example, etching of a depth of about 3 μm that is required in forming a facet of a semiconductor laser can be performed in about ten minutes.

Figure 4:
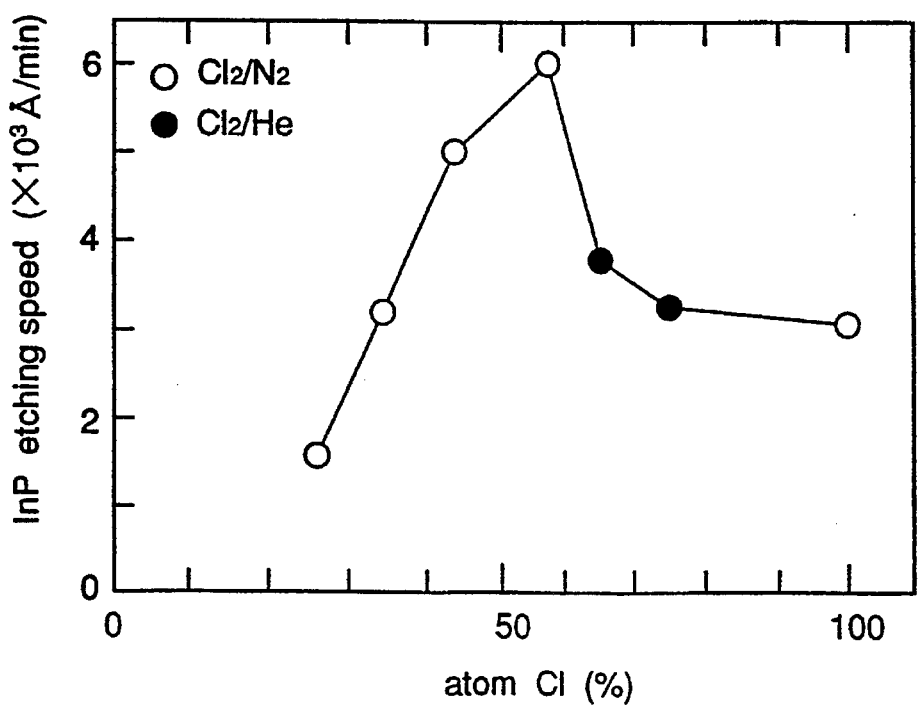
FIG. 4 is a diagram illustrating Cl excited atom light emission intensity dependency of the InP etching speed for etching InP according to the first embodiment of the present invention.

FIG. 4 is a diagram illustrating the dependency between the etching speed and Cl excited atom light emission intensity that is obtained from the gas flow rate dependency of the etching speed of an InP crystal and the He gas, $N_2$ gas dilution dependency of the Cl excited atom light emission intensity, at the above-described substrate temperature 150° C. In this figure, the abscissa represents the normalized value of Cl excited atom light emission intensity when the etching is performed at substrate temperature 150° C. under the conditions of table 1, with the Cl excited atom light emission intensity at 100% when only $Cl_2$ gas is employed, and the ordinate represents the etching speed of the InP crystal.

Next, the dependency relation of between the etching speed and the Cl excited atom light emission intensity shown in FIG. 4 is classified into three regions, Regions 1–3, shown in FIG. 4 in view of surface morphology and etched configuration, for consideration of the mechanism of etching of InP by $Cl_2/He$ gas and by $Cl_2/N_2$ gas. The characteristics of the etching in the three regions are as follows. In Region 1, the etching is performed at low etching speed and the etched configuration is vertical and the surface morphology is also preferable. In Region 2, the etching is performed at a high etching speed, and the bottom surface of the etched concave portion has a tapered configuration and there arises surface roughness. In Region 3, the etching is performed at a low etching speed and there is surface roughness.

Next, in these regions, reaction product generation and desorption reactions at the surface of the InP crystal during etching are investigated. First of all, in Region 1, the Cl excited atom light emission intensity is reduced to a great extent compared to a case where only a $Cl_2$ plasma is employed, the reaction between the Cl excited atoms at the surface of InP and In, or P advances very slowly, and an equilibrium of the desorption reaction speed between $InCl_x$ (x=1~3) and $PCl_x$ (x=1~5) is maintained. As for the configuration of the etched concave portion, when it is assumed that the desorption reaction of $InCl_x$ occurs only with the assistance of ions, it is considered possible to perform an etching that is prudent to a mask and makes a side surface configuration vertical because only a part on which ions is incident are selectively etched.

In Region 2, since the generation and desorption reaction of $InCl_x$ and $PCl_X$ at the InP surface are in an equilibrium state, the etching speed increases with an increase in the Cl excited atoms, and because the desorption of $PCl_x$ having a high vapor pressure increases to a larger value than the desorption of $InCl_x$, the balance between both at the InP surface is broken, thereby causing surface roughness.

In Region 3, since the Cl excited atom light emission intensity increases to a value larger than that of Region 2, there arises an excess generation of $InCl_x$ and $PCl_x$. Although this excess $InCl_x$ is deposited on the InP surface, the etching speed is reduced, and because the desorption of $PCl_x$ increases to a value larger than that of the Region 2, the surface is kept rough. As shown in FIG. 16, viewing such a configuration as something is taken out from at a deeper position of the rough surface, it is found that abnormal desorption of $PCl_x$ has occured.

As can been seen from the above result, in the prior art etching of InP employing chroline, it was impossible to reduce the Cl excited atom light emission intensity to below a predetermined value and, therefore, the substrate temperature has to be above about 200° C. so that a high ion energy, several hundreds to several thousands of eV, promotes the desorption of reaction products of Cl excited atoms and In. In this embodiment, however, by employing the $Cl_2/N_2$ mixture having a flow rate ratio of $Cl_2/N_2$ below 1, it is possible to reduce the Cl excited atom light emission intensity to below a predetermined value, and by using the low ion energy (several tens of eV) as shown in table 1, etching forming a vertical side surface etched configuration having an etched concave portion and a preferable surface morphology can be performed.

The flow rate ratio of $Cl_2/N_2$ in the first embodiment is obtained from the experimentations performed on the conditions that can make the atom Cl intensity the smallest when only $Cl_2$ is employed, that is, under conditions that can make the Cl excited atom light emission intensity the smallest when only $Cl_2$ gas is employed, as shown in table 1. Therefore, when the etching is performed under the conditions other than the conditions shown in table 1, it is required to increase the flow rate ratio of $N_2$ gas so that the Cl excited atom light emission intensity is below the value of the above-described embodiment.

While in the above-described embodiment the gas pressure of the $Cl_2/N_2$ mixture is 0.4 mTorr to perform etching, when the gas pressure of the mixture is increased, the Cl excited atom light emission intensity also increases and it is not possible to reduce the Cl excited atom light emission intensity below a predetermined value even if $N_2$ gas is added. Therefore, the gas pressure of the mixed gas must be at most below 0.5 mTorr to perform etching.

In this first embodiment described above, a $Cl_2/N_2$ mixture having a flow rate ratio of below 1 is employed and the etching is performed employing a $Cl_2/N_2$ mixed plasma at a low ion energy of several tens of eV and, therefore, the etching can be performed in a state where the Cl excited atom light emission intensity is suppressed to an extremely low value, thereby resulting in etching that has good surface morphology and makes a side surface configuration having an etched concave portion vertical without damaging to the InP crystal. In addition, because such etching is possible even under a low substrate temperature of about 100° C., it is possible to perform etching employing a resist mask. Furthermore, by performing etching employing an insulating film that is resistive to heat as a mask, etching that has a higher etching rate than the prior art can be performed.

Embodiment 2

An etching method of an InP crystal employing a $Cl_2/He/N_2$ mixture will be described as a second embodiment of the present invention.

Figure 3:
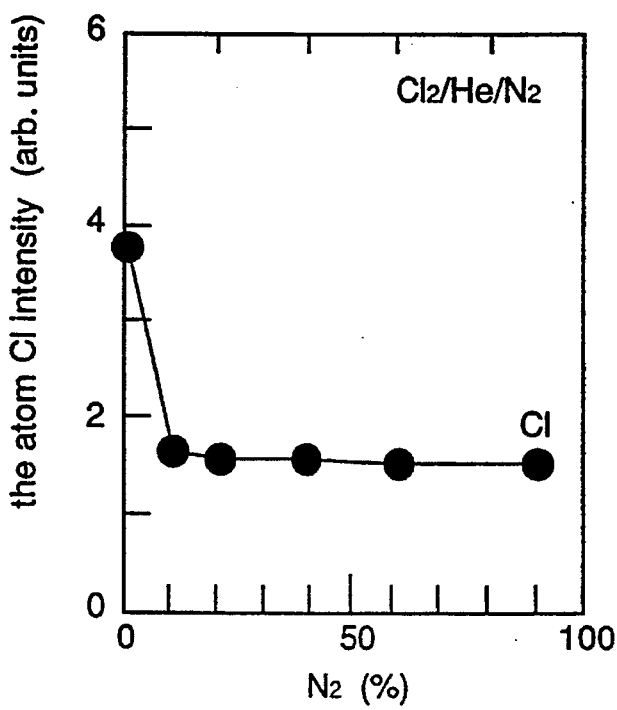
FIG. 3 is a diagram illustrating He gas, nitrogen gas dilution dependency of Cl excited atom light emission intensity according to a second embodiment of the present invention.

FIG. 3 is a diagram illustrating a relation between the atomic Cl intensity of Cl excited atoms and the mixed ratio of $Cl_2/He/N_2$ when etching under conditions shown in table 1 employing a gas that is obtained by diluting $Cl_2$ gas with a $He/N_2$ mixture. In the figure, the abscissa represents He gas concentration divided by the total gas flow rate ($He/(N_2+He+Cl_2)$) and the ordinate represents atomic Cl intensity. FIG. 3 particularly shows a relation when the flow rate ratio of $Cl_2$ gas is fixed at 1 SCCM and the mixed ratio of the entire mixture is varied by varying the $N_2$ concentration on a condition that the total gas flow rate of the mixed gas is fixed at 10 SCCM.

The etching conditions will be described. As described above, in order to perform an etching that has good surface morphology and makes a side surface configuration having an etched concave portion that is vertical without damaging to the InP crystal, it is required to reduce the Cl excited atom light emission intensity of the mixed gas that is employed in the etching to below a predetermined value. When the upper limit of this atomic Cl intensity is obtained from the etching employing $Cl_2/N_2$ gas, since it is necessary to reduce the flow rate ratio below 1 in order to perform an etching as shown in the first embodiment, the value of the atomic Cl intensity obtained from FIG. 2 when the flow rate ratio is $Cl_2/N_2$:5 SCCM/5 SCCM becomes the upper limit of the atomic Cl intensity. Therefore, when etching is performed a gas mixture under conditions that the atomic Cl intensity is below the upper limit value, an etching that has good surface morphology and a vertical side surface configuration can be obtained without damaging to the InP crystal. Therefore, when the condition for mixing gases which produces an atomic Cl intensity below the upper limit value in the etching employing $Cl_2/He/N_2$ from FIGS. 2 and 3, the flow rate ratio of $N_2/(Cl_2+He+N_2)$ may be above 10%. Accordingly, by etching under conditions shown in table 1, employing $Cl_2/He/N_2$ mixed gas in which the flow rate of $Cl_2$ gas is 10% of the entire flow rate and the flow rate of $N_2$ gas is above 10%, the Cl excited atomic light emission intensity can be reduced similarly as in the first embodiment, and etching that produces good surface morphology and makes a side configuration having an etched concaved portion that is vertical without damaging to InP can be performed.

In this second embodiment, $Cl_2/He/N_2$ mixture that includes $Cl_2$ gas with a flow rate ratio below 10% of the entire flow rate and $N_2$ gas with a flow rate ratio above 10% is employed to perform a low energy etching at several tens of eV, and similar effects as in the first embodiment are obtained.

In the above-described second embodiment, a case where the flow rate ratio of $Cl_2$ gas is fixed to 10% of the entire flow rate is examined, but even when the flow rate of $Cl_2$ gas is below 10%, the Cl excited atomic light emission intensity can be reduced with the same effects as in the above embodiment.

While $Cl_2$ gas is employed in the above-described first embodiment and $Cl_2$ gas and He gas are employed in the above-described second embodiment, in the present invention, other halogen gases may be employed in place of $Cl_2$ gas and other inactive gases may be employed in place of He gas with the same effects as in the above-described embodiments.

While in the above-described embodiments an InP crystal is used as the object to be etched, other In series compound semiconductor can be utilized with the same effects as in the above-described embodiments.

Embodiment 3

A third embodiment of the present invention that performs etching employing a $Cl_2/N_2$ mixture or a $Cl_2/He/N_2$ mixture for forming a recess of an InP series HEMT, forming an emitter mesa of an InP series HBT, forming a collector of an InP system HBT, forming a facet of an InP series laser, forming a facet of an InP series LED, and forming a mesa of an InP series MESFET will be described.

Figure 17:
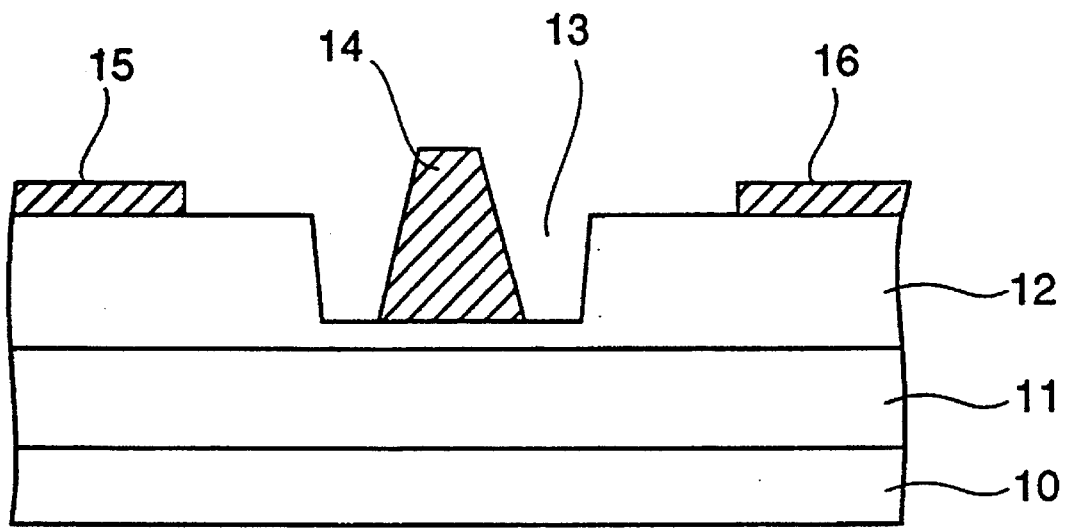
FIG. 17 is a cross-sectional view illustrating a structure of a HEMT prepared according to the third embodiment of the present invention.

FIG. 17 is a cross-sectional view illustrating a structure of an InP series HEMT. In the figure, reference numeral 10 designates an undoped InP layer, numeral 11 designates an n type InAlAs layer, numeral 12 designates an n type InGaAs layer, numeral 13 designates a recess for forming a gate electrode 14, numeral 15 designates a source electrode, and numeral 16 designates a drain electrode.

Figure 18:
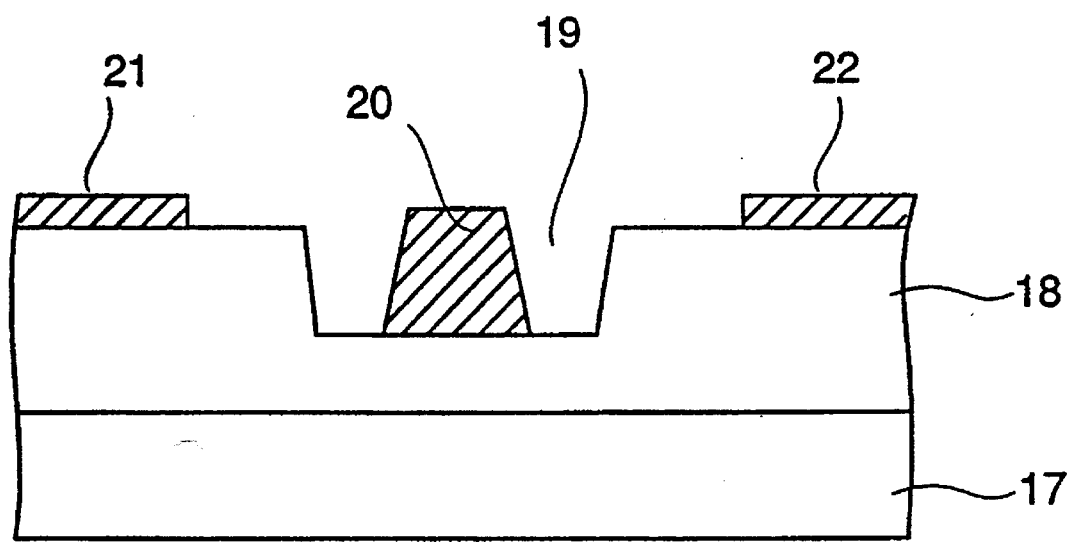
FIG. 18 is a cross-sectional view illustrating a structure of a MESFET prepared according to the third embodiment of the present invention.

FIG. 18 is a cross-sectional view illustrating an InP series MESFET. In the figure, reference numeral 17 designates an undoped InP layer, numeral 18 designates an n type InP layer, numeral 19 designates a recess for forming a gate electrode 20, numeral 21 designates a source electrode, and numeral 22 designates a drain electrode.

Figure 19:
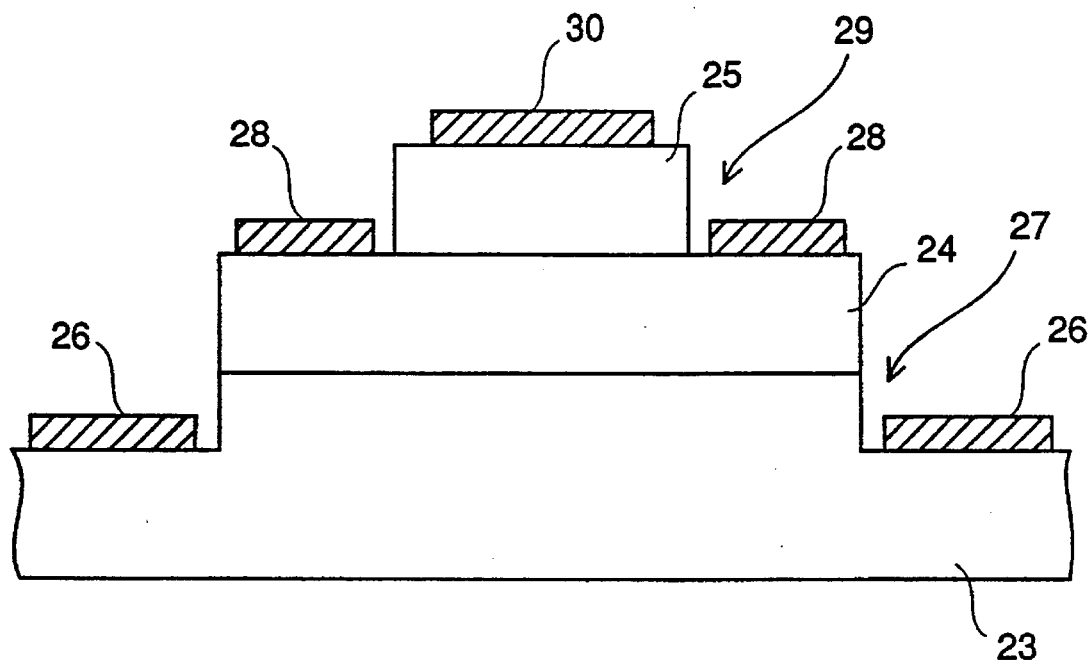
FIG. 19 is a cross-sectional view illustrating a structure of an HBT prepared according to the third embodiment of the present invention.

FIG. 19 is a cross-sectional view illustrating an InP series HBT. In the figure, reference numeral 23 designates an n type InP layer, numeral 24 designates a p type InGaAs layer, numeral 26 designates a collector electrode, and numeral 27 designates an etched groove for forming the collector electrode 26. Reference numeral 28 designates a base electrode, and numeral 29 designates a mesa for forming the base electrode 29. Reference numeral 30 designates an emitter electrode.

Figure 20:
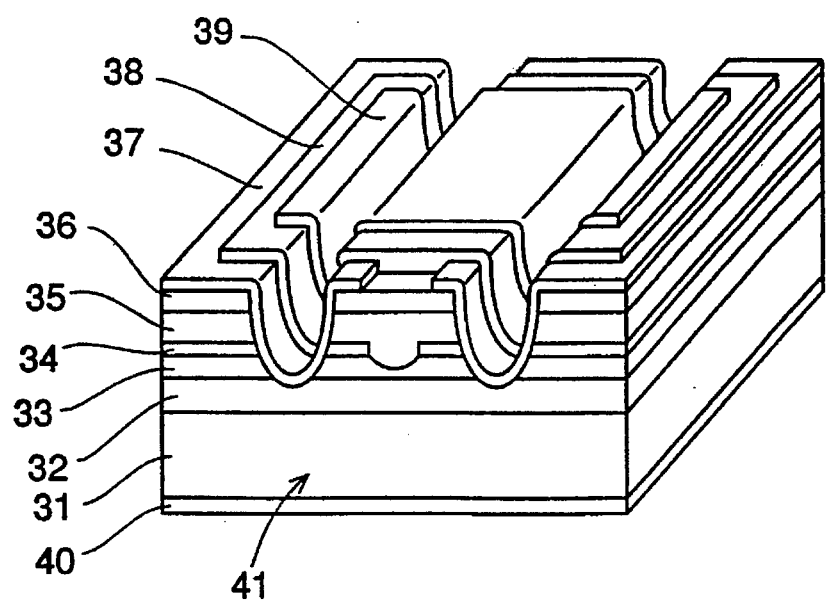
FIG. 20 is a cross-sectional view illustrating a structure of a laser prepared according to the third embodiment of the present invention.

FIG. 20 is a cross-sectional view illustrating a structure of an InP series laser. In the figure, reference numeral 31 designates an n type InP substrate, numeral 32 designates an n type InP cladding layer, numeral 33 designates a p type InP active layer, numeral 34 designates an n type InP layer, numeral 35 designates a p type InP cladding layer, numeral 36 designates a p type InGaAsP layer, numeral 37 designates an $SiO_2$ layer, numeral 38 designates a Cr/Au layer, numeral 39 designates a p side Au electrode, numeral 40 designates an Au—Ge/Au electrode, and numeral 41 designates a laser facet.

Figure 21:
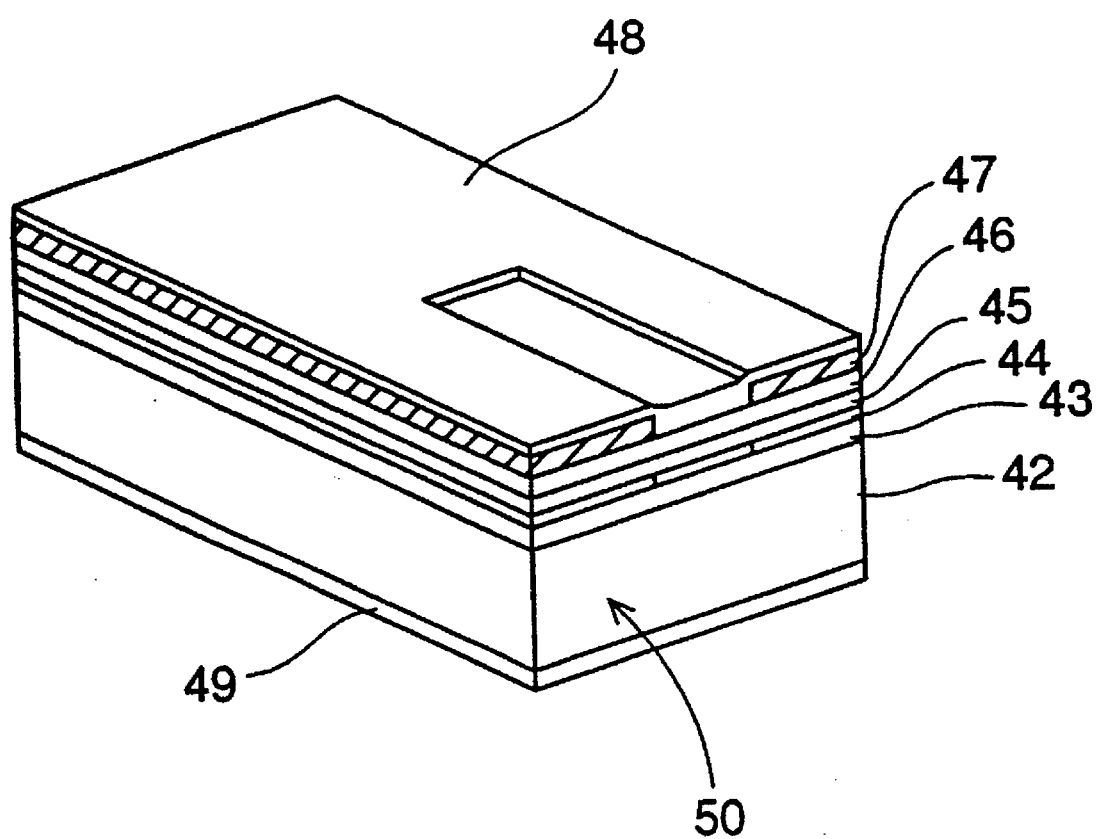
FIG. 21 is a perspective view illustrating a structure of an LED prepared according to the third embodiment of the present invention.

FIG. 21 is a cross-sectional view illustrating a structure of an InP series light emitting diode (hereinafter referred to as LED). In the figure, reference numeral 42 designates an InP substrate, numeral 43 designates an n type InP layer, numeral 44 designates a p type InGaAsP layer, numeral 45 designates a p type InP layer, numeral 46 designates a p type InGaAsP layer, numeral 47 designates an insulating film, numeral 48 designates a p side electrode, and numeral 49 designates an n side electrode, and numeral 50 designates an LED facet.

In this embodiment, etching is performed employing the $Cl_2/N_2$ mixture or the $Cl_2/He/N_2$ mixture described in the first and the second embodiments, respectively, under the conditions shown in table 1 in an ECR etching apparatus, for forming a recess 13 of a HEMT shown in FIG. 17, a recess 19 of a MESFET shown in FIG. 18, a mesa 29 for forming the emitter electrode 30, and an etched groove 27 for forming the collector electrode 26 of an HBT shown in FIG. 19, or for forming the facet 41 of a laser shown in FIG. 20, or the facet 50 of the LED shown in FIG. 21.

In this third embodiment, because the recess 13 of the HEMT or the recess 19 of the MESFET can be formed so that the side walls are vertical, it is possible to form a T-shaped gate employing side walls, whereby it is possible to shorten the gate length of a HEMT or a MESFET.

In addition, because it is possible to form a mesa 29 for forming an emitter electrode 30 of an HBT and an etched groove 27 for forming the collector electrode 26 by etching so as to be prudent to the mask pattern and so that the side walls become vertical, it is possible to miniaturize an HBT and to enhance the reproducibility of an HBT.

In addition, by forming the facet 41 of a laser or the facet 50 of an LED by making the substrate temperature about 200° C., it is possible to perform etching at a higher rate than in the prior art, thereby enabling the producibility of a laser or an LED, as described above.

According to this third embodiment of the present invention, by employing the $Cl_2/N_2$ mixed gas or $Cl_2/He/N_2$ mixed gas, etching can be performed at a low ion energy, and the formation of the recess 13, the recess 19, the mesa 29, the etched groove 27, the facet 41 of a laser, and the facet of LED 50 can be performed producing a good surface configuration and making a side surface having an etched concave portion that is vertical without damaging a semiconductor apparatus, thereby producing a high performance InP series HEMT, InP series MESFET, InP series HBT, InP series laser, and InP series LED.

As is evident from the foregoing description, according to a first embodiment of the present invention, an etching method for an In series compound semiconductor includes etching an In series semiconductor employing a mixture of a halogen and nitrogen in which the flow rate ratio of halogen and nitrogen are respectively lower than 1, and the gas pressure is below 0.5 mTorr. Therefore, etching at low ion energy that produces good surface morphology, makes a side surface configuration of an etched concave portion vertical, and causes only low damage can be performed.

According to a second aspect of the present invention, an etching method for an In series compound semiconductor, includes etching an In series semiconductor employing a mixture of halogen/inactive gas/nitrogen gas, in which the flow rate ratio of halogen/(halogen+inactive gas+nitrogen gas) is lower than 0.1, the flow rate ratio of nitrogen/(halogen+inactive gas+nitrogen gas) is above 0.1, and the gas pressure is below 0.5 mTorr. Therefore, etching at low ion energy that produces good surface morphology, makes a side surface configuration of an etched concave portion vertical, and causes only low damage, can be performed.

What is claimed is:

1. A method for etching an In compound semiconductor comprising etching a compound semiconductor including In in a plasma in a flowing mixture of a halogen and nitrogen in which the halogen flows at a lower rate than the nitrogen and gas pressure is below 0.5 mTorr.

2. The etching method of claim 1 wherein the halogen is $Cl_2$.

3. A method for etching an In compound semiconductor comprising etching a compound semiconductor including In in a plasma in a flowing mixture of a halogen, an inactive gas, and nitrogen in which halogen flow to (halogen+inactive gas+nitrogen gas) flow is lower than 0.1, nitrogen flow to (halogen+ inactive gas+nitrogen gas) flow is above 0.1, and gas pressure is below 0.5 mTorr.

4. The etching method of claim 3 wherein the inactive gas is He.

5. The etching method of claim 3 wherein the halogen is $Cl_2$.

6. The etching method of claim 4 wherein the halogen is $Cl_2$.

7. A method for etching an In compound semiconductor comprising etching a compound semiconductor including In in an electron cyclotron resonance plasma in a flowing mixture of chlorine and nitrogen in which chlorine flow to nitrogen flow is below 1, total gas flow is about 10 SCCM, gas pressure is below 0.5 mTorr, and the compound semiconductor substrate temperature is 100°–200° C.

8. A method for etching an In compound semiconductor comprising etching a compound semiconductor including In in an electron cyclotron resonance plasma in a flowing mixture of a halogen, an inactive gas, and nitrogen in which halogen flow to (halogen+inactive gas+nitrogen gas) flow is lower than 0.1, nitrogen flow to (halogen+inactive gas+nitrogen gas) flow is above 0.1, gas pressure is below 0.5 mTorr, total gas flow rate is about 10 SCCM, and the compound semiconductor substrate temperature is 100°–200° C.

* * * * *

UNITED STATES PATENT AND TRADEMARK OFFICE
CERTIFICATE OF CORRECTION

PATENT NO. : 5,512,331
DATED : April 30, 1996
INVENTOR(S) : Miyakuni

It is certified that error appears in the above-indentified patent and that said Letters Patent is hereby corrected as shown below:

Column 11, Line 21, before "gas" delete --.--.

Signed and Sealed this

Sixteenth Day of July, 1996

Attest:

BRUCE LEHMAN

*Attesting Officer*     *Commissioner of Patents and Trademarks*